United States Patent
Pilgrim et al.

(10) Patent No.: US 7,245,642 B1
(45) Date of Patent: *Jul. 17, 2007

(54) BROADBAND EXTERNAL CAVITY DIODE LASER

(75) Inventors: Jeffrey S. Pilgrim, Sante Fe, NM (US); Daniel J. Kane, Santa Fe, NM (US)

(73) Assignee: Southwest Sciences Incorporated, Santa Fe, NM (US)

( * ) Notice: Subject to any disclaimer, the term of this patent is extended or adjusted under 35 U.S.C. 154(b) by 253 days.

This patent is subject to a terminal disclaimer.

(21) Appl. No.: 10/783,193

(22) Filed: Feb. 19, 2004

Related U.S. Application Data

(63) Continuation-in-part of application No. 10/339,587, filed on Jan. 8, 2003, now Pat. No. 6,914,917.

(60) Provisional application No. 60/449,278, filed on Feb. 20, 2003.

(51) Int. Cl.
*H01S 3/10* (2006.01)
*H01S 3/08* (2006.01)

(52) U.S. Cl. .............................. 372/20; 372/92; 372/99
(58) Field of Classification Search .................. 372/20, 372/92
See application file for complete search history.

(56) References Cited

U.S. PATENT DOCUMENTS

| | | | |
|---|---|---|---|
| 5,319,668 A | 6/1994 | Luecke | |
| 5,379,310 A * | 1/1995 | Papen et al. .................. | 372/23 |
| 5,428,635 A | 6/1995 | Zhiglinsky et al. | |
| 5,771,252 A | 6/1998 | Lang et al. | |
| 5,995,521 A | 11/1999 | Moore et al. | |
| 6,040,914 A | 3/2000 | Bortz et al. | |
| 6,118,803 A | 9/2000 | Sanders et al. | |
| 6,188,705 B1 | 2/2001 | Krainak et al. | |
| 6,282,213 B1 | 8/2001 | Gutin et al. | |
| 6,614,829 B1 | 9/2003 | Tuganov et al. | |
| 6,914,917 B2 * | 7/2005 | Pilgrim et al. ................. | 372/20 |
| 2001/0036206 A1 | 11/2001 | Jerman et al. | |
| 2002/0154662 A1 | 10/2002 | Turpin et al. | |

OTHER PUBLICATIONS

Harvey, K. C., et al., "External-Cavity Diode Laser Using a Grazing-Incidence Difffraction Grating", *Optics Letters*, vol. 16, No. 12, (Jun. 15, 1991), 910-912.

Littman, M. G., et al., "Spectrally Narrow Pulsed Dye Laser Without Beam Expander", *Applied Optics*, vol. 17, No. 14, (Jul. 15, 1978),2224-2227.

Oh, D. B., et al., "Wavelength-Modulation Detection of Acetylene with a Near-Infrared External-Cavity Diode Laser", *Applied Optics*, vol. 34, No. 30, Author is co-inventer,(Oct. 20, 1995),7002-7005.

* cited by examiner

*Primary Examiner*—Armando Rodriguez
(74) *Attorney, Agent, or Firm*—Jeffrey D. Myers; Peacock Myers, P.C.

(57) ABSTRACT

An external cavity laser and a method of generating laser light via an external cavity laser comprising emitting laser light from a source, collimating light output by the source, receiving collimated light with a diffraction grating, reflecting light received from the diffraction grating back to the diffraction grating with a cavity feedback mirror, wherein at least a portion of the mirror is curved, and tuning the external cavity laser to a set of wavelengths.

48 Claims, 2 Drawing Sheets

US 7,245,642 B1

BROADBAND EXTERNAL CAVITY DIODE LASER

CROSS-REFERENCE TO RELATED APPLICATIONS

This application is a continuation-in-part application of U.S. patent application Ser. No. 10/339,587, entitled "Discrete Wavelength-Locked External Cavity Laser", to Jeffrey S. Pilgrim, et al., filed on Jan. 8, 2003 now U.S. Pat. No. 6,914,917, which claimed the benefit of filing of U.S. Provisional Patent Application Ser. No. 60/347,158, entitled "Discrete-Wavelength Locked External Cavity Laser", filed on Jan. 8, 2002, and the specifications thereof are incorporated herein by reference.

U.S. patent application Ser. No. 10/339,587 was in turn a continuation-in-part application of U.S. patent application Ser. No. 09/912,817, now U.S. Pat. No. 6,683,895, entitled "Wavelength Agile External Cavity Diode Laser", filed on Jul. 24, 2001, which claimed the benefit of filing of U.S. Provisional Patent Application Ser. No. 60/220,708, entitled "Wavelength Agile External Cavity Diode Laser", filed on Jul. 26, 2000, and the specifications thereof are incorporated herein by reference.

This application claims the benefit of the filing of U.S. Provisional Patent Application Ser. No. 60/449,278, entitled "Broadband External Cavity Diode Laser", filed on Feb. 20, 2003, and the specification thereof is incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. NAS3-01007 awarded by the U.S. National Aeronautics and Space Administration.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to optical detection of gases using external cavity diode lasers.

2. Description of Related Art

Diode lasers have become increasingly important for optical detection of gases. Because typical diode lasers have relatively short tuning ranges, a manner in which to widen the tuning range is to incorporate the diode laser as the gain element in an external cavity diode laser (ECDL). The implicit goal of this approach is to provide for an ECDL with narrow wavelength, often single frequency, emission. This narrow emission is then tuned through a broad wavelength range by various sophisticated mechanisms known in the art. This approach can lead to an ECDL optical source capable of high-sensitivity trace gas detection. However, it is often the case that survey spectra need to be obtained to simply determine whether there are spectral interferences between two or more species. In these instances, high sensitivity is not always required.

The most successful commercial ECDL is produced by New Focus, Inc. Their ECDLs are based on the Littman-Metcalf grazing incidence design. M. G. Littman and H. J. Metcalf, Appl. Opt. 17, 2224 (1978). The ECDL tunes single frequency through a particular mechanical movement of the cavity feedback mirror. New Focus, Inc. has expended significant effort to provide single mode tuning in a single mechanical movement. The requirement is that the cavity length change concomitantly with the angular selection of the cavity feedback mirror to provide single mode tuning. This capability is the basis of New Focus' U.S. Pat. Nos. 5,319,668 and 5,995,521. The present invention obviates the requirement for single mode tuning in by employing multi-mode operation of the ECDL.

BRIEF SUMMARY OF THE INVENTION

The present invention is of an external cavity laser and a method of generating laser light via an external cavity laser, comprising: emitting laser light from a source; collimating light output by the source; receiving collimated light with a diffraction grating; reflecting light received from the diffraction grating back to the diffraction grating with a cavity feedback mirror, wherein at least a portion of the mirror is curved; and tuning the external cavity laser to a set of wavelengths. In the preferred embodiment, the source comprises a Fabry-Perot diode laser, preferably wherein the diode laser comprises no anti-reflection coating or an anti-reflection coating that does not suppress the diode laser's Fabry-Perot modes, and most preferably wherein tuning comprises selecting a plurality of Fabry-Perot modes of the diode laser for the external cavity laser output. A tunable filter element (preferably a monochromator or spectrometer) may be employed to obtain absorption spectra for a plurality of wavelengths. Preferably at least a portion of the mirror is spherical, more preferably wherein a distance from the mirror to a point of diffraction of the diffraction grating is approximately a radius of curvature of the spherical portion of the mirror, and most preferably wherein all wavelengths are retroreflected by the mirror. Preferably the maximum bandwidth of the laser is approximately equal to an angular spread of the spherical portion of the mirror subtended by a spatial extent of the spherical portion of the mirror. Output of the laser is preferably a zeroeth order output of the diffraction grating. The curved portion of the mirror is preferably curved in a plane of diffraction of the diffraction grating. The external cavity length of the laser substantially determines maximum spectral resolution of the laser, preferably by substantially determining a longitudinal mode spacing, more preferably wherein the length is less than a resolving power of the tunable filter employed with the laser, and most preferably wherein the laser appears continuous to the tunable filter. The diffraction grating may be placed substantially at a focus of the curved portion of the mirror, preferably wherein the diffraction grating and the curved portion of the mirror form a zero-dispersion stretcher assembly, the gain of the laser corresponds to a round-trip time of a cavity of the laser, and/or the gain of the laser corresponds to a harmonic or sub-harmonic of a frequency determined by a round-trip time of a cavity of the laser.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The ECDL of the present invention provides a laser output that spans a wide wavelength range. Thus, the laser output comprises many simultaneous output frequencies. The broadband ECDL of the invention can then be likened to a light emitting diode source except that the external cavity mode structure is preserved. Because the ECDL is used as a broadband optical source, a tunable filter element is preferably used to obtain absorption spectra versus wavelength. This tunable filter element is preferably a monochromator or spectrometer.

The invention described herein uses an external cavity design while circumventing the narrow frequency limitations of present external cavity lasers. Furthermore, in contrast to present external cavity laser designs, the design is rugged and inexpensive to implement. The ability of the invention to provide an output spanning a broad wavelength region greatly improves the utility for obtaining survey spectra without tuning the laser.

Figure 1:
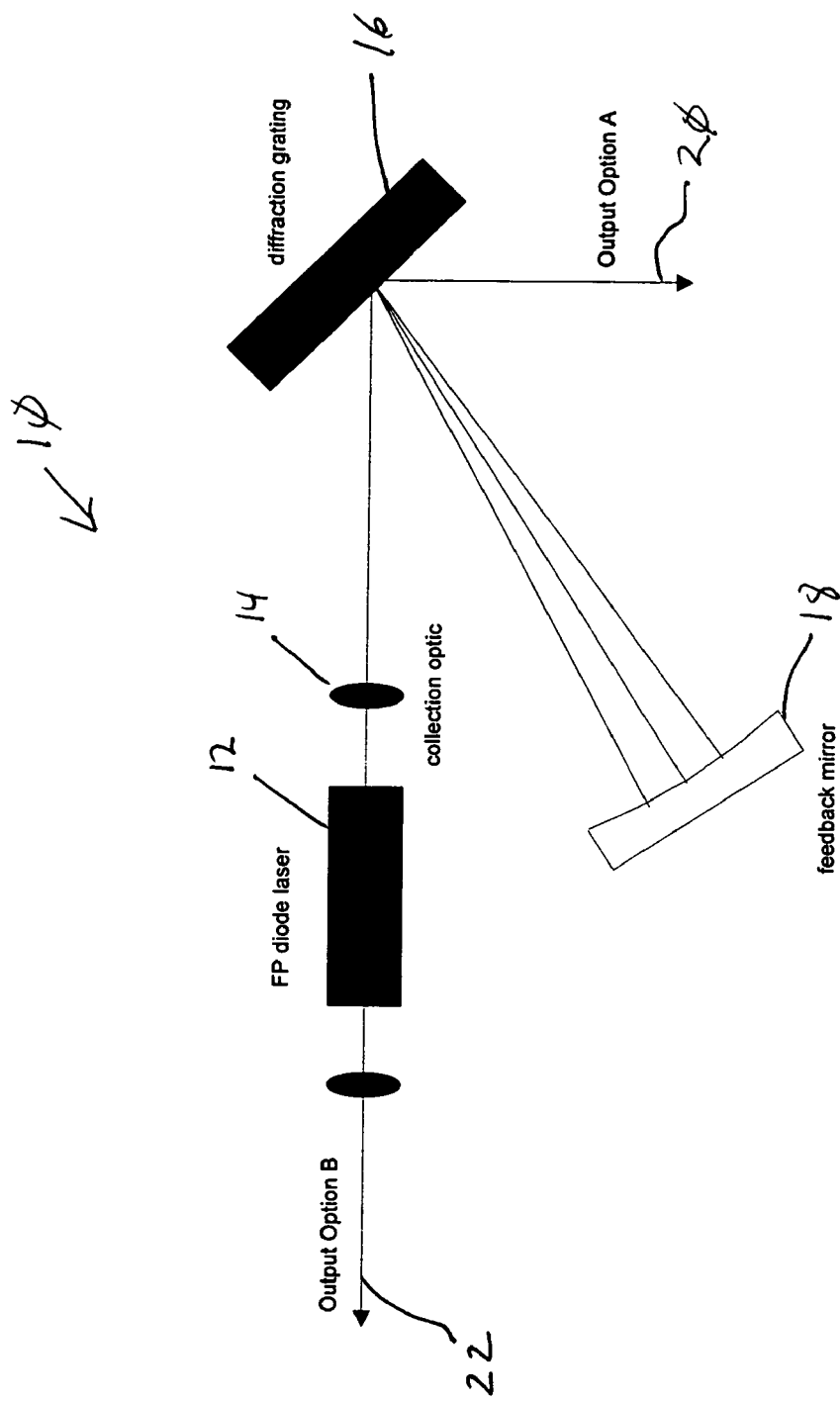
FIG. 1 is a schematic drawing of the components comprising the broadband ECDL of the invention, wherein the laser diode output is collimated with a lens and directed to a diffraction grating where wavelength selection occurs; the diffracted beam is retroreflected from a curved cavity feedback mirror to complete the laser resonator.

FIG. 1 is a schematic drawing of the components that constitute the broadband ECDL invention 10. The schematic is based on the Littman-Metcalf design as modified by Harvey and Myatt (K. C. Harvey and C. J. Myatt, Opt. Lett. 16, 910 (1991)). However, a Fabry-Perot diode laser 12 is used as the gain element, preferably with either no anti-reflection coating applied or with an anti-reflection coating that is not sufficient to suppress the diode's Fabry-Perot modes. The laser diode output is collimated with a lens 14 or equivalent collimating means and directed to a diffraction grating 16 where wavelength selection occurs. The diffracted beam is retroreflected from the curved cavity feedback mirror 18 to complete the laser resonator. ECDL output 20 provides means for monitoring ECDL output power, such as with a detector and polarization extinction ratio (e.g., polarization selective optic and detector). ECDL output 22 is shown for collecting the ECDL output for use in a fiber optic network. It should be appreciated that output 20 may be used for collection and use in a fiber optic network and output 22 may be used for wavelength locking. A position sensitive detector may also be employed. A voltage/current meter may be employed for monitoring the diode laser compliance voltage or compliance current. Various combinations of outputs and locations of elements situated for discrete wavelength locking may be employed as understood by one of skill in the art. The optional components are described in more detail in U.S. patent application Ser. No. 10/339,587.

The ECDL of the invention is based on the Littman-Metcalf design as modified by Harvey and Myatt, but employs a curved feedback mirror so that multiple wavelengths are in the feedback condition to form an external cavity resonator. Previous ECDL designs use a flat feedback mirror that is rotated to select the laser output wavelength. It is of advantage in the present invention to use a spherical mirror as the feedback mirror where the distance from the feedback mirror to the point of diffraction is the radius of curvature of the mirror. In this condition, each wavelength that is diffracted from the grating and travels to the spherical mirror is retroflected. Thus, many wavelengths are simultaneously oscillating in the external cavity.

The theoretical bandwidth of the invention is that given by the angular spread subtended by the spatial extent of the spherical mirror. The general wavelength region is determined by what portion of the diffraction circle, with origin at the point of diffraction, is intercepted by the feedback mirror. Preferably the zeroeth order output of the diffraction grating is used as the laser output. A significant advantage over other broadband optical sources such as LEDs and SLDs is the high beam quality for directing into and out of multiple pass absorption cells or sending across a room. Coarse wavelength selectivity is achieved by setting the mirror at a particular wavelength region on the diffraction circle.

Several features of this implementation of the Littman-Metcalf base design make it unique from and non-obvious in view of prior implementations and provide functionality that is essential for broadband direct absorption spectroscopy. A listing and explanation of certain such features follows.

First, the invention utilizes a curved feedback mirror. In contrast to commercial implementations of the Littman-Metcalf resonator, the feedback mirror in the present invention is curved. It is at least curved in the plane of diffraction but may be spherical also. By providing continuous spectral feedback with this mirror through intercepting a diffracted order from the grating, broadband laser emission is obtained. Preferably the curved mirror is separated from the point of diffraction by the mirror radius of curvature. The nominal wavelength range obtained is determined by what portion of diffracted wavelengths is intercepted by the curved feedback mirror. Moving the placement of the feedback mirror on the wavelength diffraction circle will change what set of wavelengths may oscillate in the external cavity.

Second, the external cavity length determines the maximum spectral resolution available. The length of the external cavity determines the external cavity longitudinal mode spacing. It is preferable to make this spacing smaller than the resolving power of the tunable filter used to obtain spectra. In this manner, the broadband ECDL appears to the tunable filter to be continuous.

Figure 2:
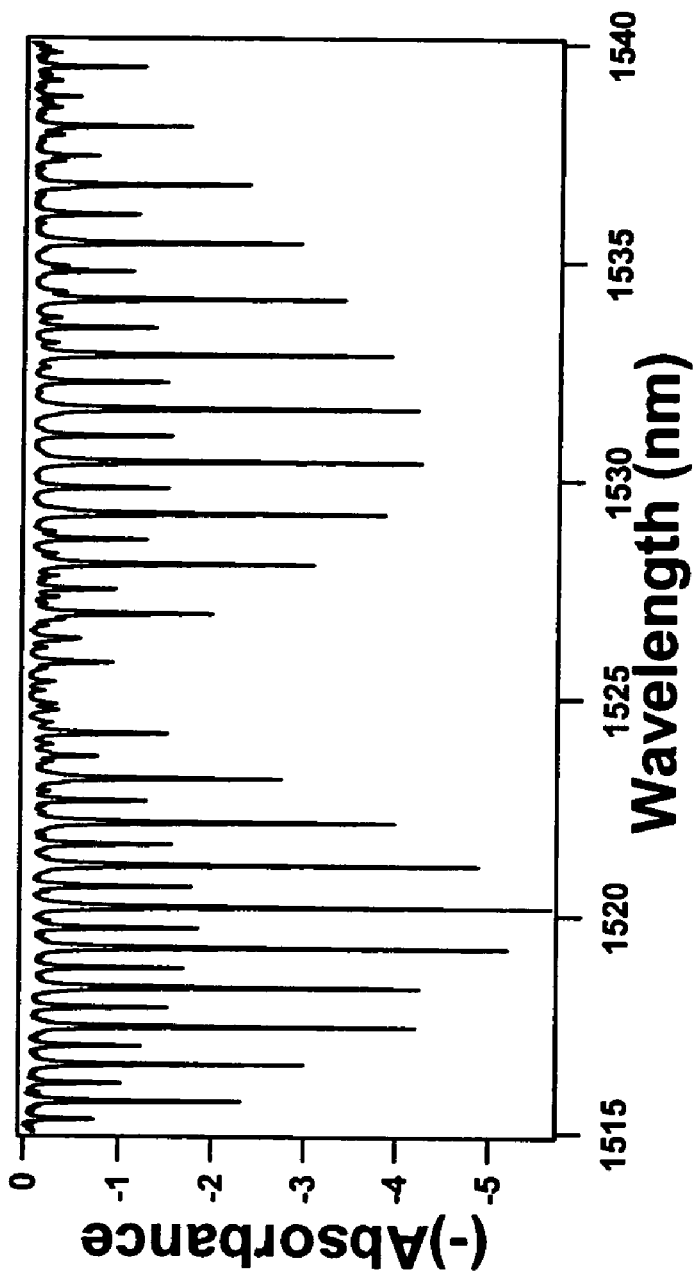
FIG. 2 is a spectrum of acetylene obtained with the ECDL of the present invention obtained by subtracting a spectrum without acetylene from a spectrum with acetylene present; because the monochromator was operated in logarithmic mode, the returned spectrum is in negative absorbance units.

Experiment demonstrated the ability to obtain survey spectra using the broadband ECDL of the invention, which provides over 25 nm of broadband laser output. FIG. 2 shows a broad spectrum obtained for acetylene around 1525 nm using the present invention. Two spectra were obtained. A background spectrum was obtained in which the ECDL output was directed through an absorption cell, but which cell did not contain the acetylene absorber. A second spectrum was then obtained in which the absorption cell did contain the acetylene absorber. The background spectrum was then subtracted from the signal-containing spectrum to obtain the data of FIG. 2. Because the spectrometer measured the laser output in dBm, the subtracted spectra return the signal in units of dimensionless absorbance.

Because the present invention preferably does not utilize mechanically modulated optical components, piezoelectric translators (PZT) and the associated drive electronics are preferably not used. The invention only requires standard electronics drivers for the diode laser injection current and temperature.

Rather than making a tunable single-mode laser through movement of an intracavity optic, the present invention relies on broadband laser output with the discrete wavelengths determined by the ECDL longitudinal mode spacing. For simplicity, the mode spacing may be less than the resolving power of the spectral measurement instrument. The ECDL output then appears to be continuous in wavelength. It is preferred to tailor the cavity length to the absorption feature of interest so that the ECDL mode spacing is sufficiently small in order to obtain adequate resolution of the absorption line shape in conjunction with a spectrometer, or other tunable filter, with adequate resolution.

It should be appreciated that coarse tuning of the output wavelength can be achieved through common techniques used with typical diode lasers. Examples of such tuning means are appropriate circuitry for injection current tuning and diode gain element temperature tuning.

A commercial advantage of the present invention is that the broadband ECDL can be applied to direct absorption spectroscopic detection of species inexpensively. Furthermore, the broad output bandwidth allows for absorbers with broad absorption features like liquids and solids. In addition, the broad bandwidth finds application in the test and measurement of passive optical components. The simplicity of the design also allows use with unsophisticated diode gain media. As a result, there is a large suite of wavelengths available from readily obtained diode laser chips.

The present invention can also be employed to form a broadband ECDL ultrafast laser. The grating in the cavity can be placed at the focus of the curved mirror, which forms a zero-dispersion stretcher compressor commonly used in ultrafast laser research. Thus, the cavity can be designed to have very low dispersion; that is, the round-trip time for every wavelength is the same. Consequently, such a broadband diode laser according to the invention provides an ideal design for an ultrafast laser.

To get the laser to produce ultrafast optical pulses, the gain in the diode laser gain chip can be pulsed at the round-trip time of the cavity, mode-locking the cavity. Proper mode-locking may also be achieved by pulsing the gain of the diode laser gain chip at frequencies that are either a harmonic or sub-harmonic of the frequency determined by the cavity round-trip time. The distance between the curved mirror and the grating, in addition to the mirror tilt, can be adjusted to optimize the cavity for ultrashort pulse operation and compensate for the dispersion inherent in the gain region of the cavity. Furthermore, other optical elements can be added to the cavity to compensate for dispersion as well. One example would be a phase mask placed between the curved mirror and the grating.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An external cavity laser comprising:
   a single laser light source comprising a Fabry-Perot diode laser;
   means for collimating light output by said laser light source;
   a diffraction grating receiving collimated light;
   a cavity feedback mirror reflecting light received from said diffraction grating back to said diffraction grating, wherein at least a portion of said mirror is curved; and
   means for tuning said external cavity laser to a set of wavelengths.

2. The external cavity laser of claim 1 wherein said diode laser comprises no anti-reflection coating or an anti-reflection coating that does not suppress said diode laser's Fabry-Perot modes.

3. The external cavity laser of claim 2 wherein said tuning means comprises means for selecting a plurality of Fabry-Perot modes of said diode laser for the external cavity laser output.

4. The external cavity laser of claim 1 additionally comprising a tunable filter element to obtain absorption spectra for a plurality of wavelengths.

5. The external cavity laser of claim 4 wherein said tunable filter element is selected from the group consisting of monochromators and spectrometers.

6. The external cavity laser of claim 1 wherein at least a portion of said mirror is curved spherically.

7. The external cavity laser of claim 6 wherein a distance from said mirror to a point of diffraction of said diffraction grating is approximately a radius of curvature of said spherical portion of said mirror.

8. The external cavity laser of claim 7 wherein all wavelengths are retroreflected by said mirror.

9. The external cavity laser of claim 6 wherein a maximum bandwidth of said laser is approximately equal to an angular spread of said spherical portion of said mirror subtended by a spatial extent of said spherical portion of said mirror.

10. The external cavity laser of claim 1 wherein output of said laser is a zeroeth order output of said diffraction grating.

11. The external cavity laser of claim 1 wherein said curved portion of said mirror is curved in a plane of diffraction of said diffraction grating.

12. The external cavity laser of claim 1 wherein an external cavity length of said laser substantially determines maximum spectral resolution of said laser.

13. The external cavity laser of claim 12 wherein said length substantially determines a longitudinal mode spacing.

14. The external cavity laser of claim 13 wherein said length is less than a resolving power of a tunable filter employed with said laser.

15. The external cavity laser of claim 14 wherein said laser appears continuous to the tunable filter.

16. The external cavity laser of claim 1 wherein said diffraction grating is substantially at a focus of said curved portion of said mirror.

17. The external cavity laser of claim 16 wherein said diffraction grating and said curved portion of said mirror form a zero-dispersion stretcher assembly.

18. The external cavity laser of claim 16 wherein a gain of said laser corresponds to a round-trip time of a cavity of said laser.

19. The external cavity laser of claim 16 wherein a gain of said laser corresponds to a harmonic or sub-harmonic of a frequency determined by a round-trip time of a cavity of said laser.

20. A method of generating laser light via an external cavity laser, the method comprising:
    emitting laser light from a single source comprising a Fabry-Perot diode laser;
    collimating light output by the source;
    receiving collimated light with a diffraction grating;
    reflecting light received from the diffraction grating back to the diffraction grating with a cavity feedback mirror, wherein at least a portion of the mirror is curved; and
    tuning the external cavity laser to a set of wavelengths.

21. The method of claim 20 wherein the diode laser comprises no anti-reflection coating or an anti-reflection coating that does not suppress the diode laser's Fabry-Perot modes.

22. The method of claim 21 wherein the tuning step comprises selecting a plurality of Fabry-Perot modes of the diode laser for the external cavity laser output.

23. The method of claim 20 additionally comprising the step of employing a tunable filter element to obtain absorption spectra for a plurality of wavelengths.

24. The method of claim 23 wherein the tunable filter element is selected from the group consisting of monochromators and spectrometers.

25. The method of claim 20 wherein at least a portion of the mirror is curved spherically.

26. The method of claim 25 wherein a distance from the mirror to a point of diffraction of the diffraction grating is approximately a radius of curvature of the spherical portion of the mirror.

27. The method of claim 26 wherein all wavelengths are retroreflected by the mirror.

28. The method of claim 25 wherein a maximum bandwidth of the laser is approximately equal to an angular spread of the spherical portion of the mirror subtended by a spatial extent of the spherical portion of the mirror.

29. The method of claim 20 wherein output of the laser is a zeroeth order output of the diffraction grating.

30. The method of claim 20 wherein the curved portion of the mirror is curved in a plane of diffraction of the diffraction grating.

31. The method of claim 20 wherein an external cavity length of the laser substantially determines maximum spectral resolution of the laser.

32. The method of claim 31 wherein the length substantially determines a longitudinal mode spacing.

33. The method of claim 32 wherein the length is less than a resolving power of a tunable filter employed with the laser.

34. The method of claim 33 wherein the laser appears continuous to the tunable filter.

35. The method of claim 20 wherein the diffraction grating is substantially at a focus of the curved portion of the mirror.

36. The method of claim 35 wherein the diffraction grating and the curved portion of the mirror form a zero-dispersion stretcher assembly.

37. The method of claim 35 wherein a gain of the laser corresponds to a round-trip time of a cavity of the laser.

38. The method of claim 35 wherein a gain of the laser corresponds to a harmonic or sub-harmonic of a frequency determined by a round-trip time of a cavity of the laser.

39. An external cavity laser comprising:
    a single laser light source;
    means for collimating light output by said laser light source;
    a diffraction grating receiving collimated light;
    a cavity feedback mirror reflecting light received from said diffraction grating back to said diffraction grating, wherein at least a portion of said mirror is curved;
    means for tuning said external cavity laser to a set of wavelengths; and
    a tunable filter element to obtain absorption spectra for a plurality of wavelengths.

40. The external cavity laser of claim 39 wherein said tunable filter element is selected from the group consisting of monochromators and spectrometers.

41. An external cavity laser comprising:
    a single laser light source;
    means for collimating light output by said laser light source;
    a diffraction grating receiving collimated light;
    a cavity feedback mirror reflecting light received from said diffraction grating back to said diffraction grating, wherein at least a portion of said mirror is curved; and
    means for tuning said external cavity laser to a set of wavelengths; and
    wherein an external cavity length of said laser substantially determines maximum spectral resolution of said laser, said length substantially determines a longitudinal mode spacing, and said length is less than a resolving power of a tunable filter employed with said laser.

42. The external cavity laser of claim 38 wherein said laser appears continuous to the tunable filter.

43. An external cavity laser comprising:
    a single laser light source;
    means for collimating light output by said laser light source;
    a diffraction grating receiving collimated light;
    a cavity feedback mirror reflecting light received from said diffraction grating back to said diffraction grating, wherein at least a portion of said mirror is curved; and
    means for tuning said external cavity laser to a set of wavelengths; and
    wherein said diffraction grating is substantially at a focus of said curved portion of said mirror and wherein a gain of said laser corresponds to a harmonic or sub-harmonic of a frequency determined by a round-trip time of a cavity of said laser.

44. A method of generating laser light via an external cavity laser, the method comprising:
    emitting laser light from a single source;
    collimating light output by the source;
    receiving collimated light with a diffraction grating;
    reflecting light received from the diffraction grating back to the diffraction grating with a cavity feedback mirror, wherein at least a portion of the mirror is curved;
    tuning the external cavity laser to a set of wavelengths; and
    employing a tunable filter element to obtain absorption spectra for a plurality of wavelengths.

45. The method of claim 44 wherein the tunable filter element is selected from the group consisting of monochromators and spectrometers.

46. A method of generating laser light via an external cavity laser, the method comprising:
  emitting laser light from a single source;
  collimating light output by the source;
  receiving collimated light with a diffraction grating;
  reflecting light received from the diffraction grating back to the diffraction grating with a cavity feedback mirror, wherein at least a portion of the mirror is curved; and
  tuning the external cavity laser to a set of wavelengths; and
  wherein an external cavity length of the laser substantially determines maximum spectral resolution of the laser, wherein the length substantially determines a longitudinal mode spacing, and wherein the length is less than a resolving power of a tunable filter employed with the laser.

47. The method of claim 44 wherein the laser appears continuous to the tunable filter.

48. A method of generating laser light via an external cavity laser, the method comprising:
  emitting laser light from a single source;
  collimating light output by the source;
  receiving collimated light with a diffraction grating;
  reflecting light received from the diffraction grating back to the diffraction grating with a cavity feedback mirror, wherein at least a portion of the mirror is curved; and
  tuning the external cavity laser to a set of wavelengths; and
  wherein the diffraction grating is substantially at a focus of the curved portion of the mirror and wherein a gain of the laser corresponds to a harmonic or sub-harmonic of a frequency determined by a round-trip time of a cavity of the laser.

* * * * *